United States Patent
Yializis et al.

(10) Patent No.: US 6,441,553 B1
(45) Date of Patent: Aug. 27, 2002

(54) ELECTRODE FOR GLOW-DISCHARGE ATMOSPHERIC-PRESSURE PLASMA TREATMENT

(75) Inventors: Angelo Yializis; Wolfgang Decker; Michael G. Mikhael, all of Tuscon, AZ (US); Shahid A. Pirzada, Fremont, CA (US)

(73) Assignee: Sigma Technologies International, Inc., Tucson, AZ (US)

( * ) Notice: Subject to any disclaimer, the term of this patent is extended or adjusted under 35 U.S.C. 154(b) by 0 days.

(21) Appl. No.: 09/660,003

(22) Filed: Sep. 12, 2000

Related U.S. Application Data

(63) Continuation-in-part of application No. 09/241,882, filed on Feb. 1, 1999, now Pat. No. 6,118,218.

(51) Int. Cl.$^7$ ................................................. H01J 7/24
(52) U.S. Cl. ................................ 315/111.21; 118/50.1; 118/723 E; 118/723 R; 219/121.36
(58) Field of Search ...................... 315/111.21, 111.31, 315/111.81, 111.91; 118/50.1, 722, 723 R, 723 E, 723 ER, 724, 725, 729, 730, 732; 219/121.36, 121.43

(56) References Cited

U.S. PATENT DOCUMENTS

| | | | |
|---|---|---|---|
| 5,387,842 A | * 2/1995 | Roth et al. | 315/111.21 |
| 5,403,453 A | 4/1995 | Roth et al. | 204/164 |
| 5,414,324 A | 5/1995 | Roth et al. | 315/111.21 |
| 5,456,972 A | 10/1995 | Roth et al. | 428/224 |
| 5,558,843 A | 9/1996 | Glocker et al. | 422/186.05 |
| 5,669,583 A | 9/1997 | Roth | 244/130 |
| 5,714,308 A | 2/1998 | Romach et al. | 430/523 |
| 5,753,886 A | * 5/1998 | Iwamura et al. | 219/121.43 |
| 5,767,469 A | 6/1998 | Glocker et al. | 204/157.15 |
| 5,789,145 A | 8/1998 | Glocker et al. | 430/527 |
| 5,968,377 A | * 10/1999 | Yusa et al. | 219/121.43 |

* cited by examiner

*Primary Examiner*—Don Wong
*Assistant Examiner*—Thuy Vinh Tran
(74) *Attorney, Agent, or Firm*—Antonio R. Durando; Durando Birdwell & Janke PLC

(57) ABSTRACT

A porous metallic layer is incorporated in one of the electrodes of a plasma treatment system. A plasma gas is injected into the electrode at substantially atmospheric pressure and allowed to diffuse through the porous layer, thereby forming a uniform glow-discharge plasma. The film material to be treated is exposed to the plasma created between this electrode and a second electrode covered by a dielectric layer. Because of the micron size of the pores of the porous metal, each pore also produces a hollow cathode effect that facilitates the ionization of the plasma gas. As a result, a steady-state glow-discharge plasma is produced at atmospheric pressure and at power frequencies as low as 60 Hz. According to another aspect of the invention, vapor deposition is carried out in combination with plasma treatment by vaporizing a substance of interest, mixing it with the plasma gas, and diffusing the mixture through the porous electrode. A heater is used to maintain the temperature of the electrode above the condensation temperature of the substance to prevent deposition during diffusion. Thus, plasma treatment and vapor deposition can be carried out on a target substrate at the same time at atmospheric pressure.

39 Claims, 12 Drawing Sheets

ELECTRODE FOR GLOW-DISCHARGE ATMOSPHERIC-PRESSURE PLASMA TREATMENT

RELATED APPLICATIONS

This application is a continuation-in-part of U.S. Ser. No. 09/241,882, filed on Feb. 1, 1999, U.S. Pat. No. 6,118,218.

BACKGROUND OF THE INVENTION

1. Field of the Invention

This invention relates generally to methods and apparatus for producing plasma; in particular, the invention relates to an electrode for establishing a steady-state glow-discharge plasma at atmospheric pressure and low temperatures.

2. Description of the Related Art

Plasma is an ionized form of gas that can be obtained by ionizing a gas or liquid medium using an AC or DC power source. A plasma, commonly referred to as the fourth state of matter, is an ensemble of randomly moving charged particles with sufficient density to remain, on average, electrically neutral. Plasmas are used in very diverse processing applications, ranging from the manufacture of integrated circuits for the microelectronics industry, to the treatment of fabric and the destruction of toxic wastes.

In particular, plasmas are widely used for the treatment of organic and inorganic surfaces to promote adhesion between various materials. For example, polymers that have chemically inert surfaces with low surface energies do not allow good bonding with coatings and adhesives. Thus, these surfaces need to be treated in some way, such as by chemical treatment, corona treatment, flame treatment, and vacuum plasma treatment, to make them receptive to bonding with other substrates, coatings, adhesives and printing inks. Corona discharge, physical sputtering, plasma etching, reactive ion etching, sputter deposition, plasma-enhanced chemical vapor deposition, ashing, ion plating, reactive sputter deposition, and a range of ion beam-based techniques, all rely on the formation and properties of plasmas.

Corona discharges are widely used in particular for treating plastic films, foils, papers, etc. to promote adhesion with other materials by increasing the surface energy of the film. A corona discharge is established between two electrodes by applying a high voltage to one of the electrodes while the other is connected to ground at typical frequencies in the order of 10–50 kHz. These conditions produce locally concentrated discharges known in the art as streamers, which lead to some non-uniformity in the treatment of film surfaces and can also damage the film by producing low molecular weight species that adversely affect adhesion to the surface. Furthermore, the streamers of corona treatment can produce backside effects on the film being treated, which is undesirable in many applications. Nevertheless, corona treatment is extensively used in the industry for improving the surface energy of materials.

Glow-discharge plasma treatment is also an effective method of treating surfaces to increase their wettability and adhesion to various materials. Glow discharge provides a more uniform and homogenous plasma that produces a more consistent surface treatment than corona treatment, thereby avoiding unintentional back treatment of the film. Glow-discharge plasma is characterized by high-energy electrons that collide with, dissociate and ionize low-temperature neutrals, creating highly reactive free radicals and ions. These reactive species enable many chemical processes to occur with otherwise unreactive low-temperature feed stock and substrates. Based on these properties, low-density glow-discharge plasmas are usually utilized for low material-throughput processes involving surface modification. These plasmas are typically formed by partially ionizing a gas at a pressure well below atmosphere. For the most part, these plasmas are weakly ionized, with an ionization fraction of $10^{-5}$ to $10^{-1}$, established with AC or DC power in systems with varied geometries. These systems always require vacuum chambers and pumps to maintain a low pressure, which increases operating costs and maintenance.

There has been an extensive effort to develop plasma systems capable of operating at atmospheric pressure for surface treatment of polymer films, foils, and paper, in order to avoid capital and maintenance expenditures for vacuum chambers and pumps. It is known that atmospheric plasma can be generated at relatively low temperatures with a proper power source, the insertion of a dielectric layer between the electrodes, and the use of an appropriate gas mixture as plasma medium. For surface treatment of polymer films, fabrics, paper, etc., atmospheric plasma can be established between two electrodes using an inert gas such as helium under particular operating conditions. Usually one electrode is attached to a high voltage power supply, and a rotating drum is grounded and acts as the other electrode. One electrode is coated with a ceramic layer and the plasma gas is injected between electrodes.

Examples of glow-discharge plasma systems operating at atmospheric pressure are described in U.S. Pat. Nos. 5,387,842, 5,403,453, 5,414,324, 5,456,972, 5,558,843, 5,669,583, 5,714,308, 5,767,469, and 5,789,145. Co-owned U.S. Pat. No. 6,118,218, incorporated herein by reference, disclosed a plasma treatment system capable of producing a steady glow discharge at atmospheric pressure with different gas mixtures operating at frequencies as low as 60 Hz. The invention consists of incorporating a porous metallic layer in one of the electrodes of a plasma treatment system. A plasma gas is injected into the electrode at substantially atmospheric pressure and allowed to diffuse through the porous layer, thereby forming a uniform glow-discharge plasma. As in prior-art devices, the film material to be treated is exposed to the plasma created between this electrode and a second electrode covered by a dielectric layer. Because of the micron size of the pores of the porous metal, each pore also produces a hollow cathode effect that facilitates the ionization of the plasma gas. As a result, a steady-state glow-discharge plasma is produced at atmospheric pressure and at power frequencies as low as 60 Hz. The inventors discovered that, in order for the electrode holes to operate effectively for producing an optimal glow discharge, their size must approach the mean free path of the plasma gas at the system's operating pressure.

Thus, the ability to produce a reliable and uniform glow-discharge plasma at atmospheric pressure has greatly improved the flexibility of operation of plasma treatment processes, but a serious constraint remains as a result of the required geometry of the apparatus. As illustrated in FIG. 1, conventional plasma treatment systems consists substantially of a plasma treater 10 mounted on a roller 12. A film 14 of material to be treated is passed through the system between the plasma treater and the roller. The roller 12 is grounded and coated with a dielectric material 16, such as polyethylene teraphthalate (PET). The plasma treater 10 contains at least one electrode which is connected, through a cable 18, to an AC power supply 20. The treater is held in place by a holding bracket 22 designed to maintain a distance of 1–2 mm between the roller 12 and the treater 10.

This distance, which varies with operating conditions, plasma medium composition, and electrode configuration, is important in establishing a steady plasma flow; therefore, it is very desirable to maintain a gap determined to be optimal. Plasma gas, such as helium, argon, and mixtures of an inert gas with nitrogen, oxygen, air, carbon dioxide, methane, acetylene, propane, ammonia, or mixtures thereof, are used to sustain a uniform and steady plasma. The gas is supplied to the treater 10 through a manifold 24 that feeds the electrode of the apparatus.

As a result of this conventional configuration of plasma treaters, the film substrate 14 being treated is necessarily always bound by the two electrodes of the system (that is, the plasma electrode and the grounded roller). Since plasma formation is achieved only within a limited range of spacing between the two electrodes, the substrate to be treated is obviously also limited in thickness and shape. Therefore, it would be very desirable to have plasma treatment apparatus capable of treating the surface of substrates regardless of their thickness and shape. The present invention relates to an improved electrode for operation under such advantageous conditions.

BRIEF SUMMARY OF THE INVENTION

The primary objective of this invention is an electrode assembly that can be operated to produce plasma without extending the electric field through the substrate material being treated, thereby making it possible to treat thicker material than ever before possible.

Another goal is an electrode assembly that can be used to treat substrates without limitations based on shape or chemical composition of the substrate.

Another objective is also an electrode assembly that makes it possible to treat a particulate substrate three dimensionally.

Another goal is an atmospheric-pressure glow-discharge plasma system operable under steady-state conditions at a relatively low temperature.

Yet another objective is a plasma-treatment process that can be carried out using a power system operating at relatively low frequencies.

Still another objective is an electrode assembly that is suitable for incorporation with existing plasma equipment.

Another goal is also a device suitable for combining plasma treatment with vapor deposition at atmospheric pressure.

A final objective is a plasma-treatment process that can be implemented easily and economically according to the above stated criteria.

Therefore, according to these and other objectives, the preferred embodiment of the invention consists of two metallic electrodes embedded side by side in a dielectric medium having a porous outer layer defining an exposed treatment space. One of the electrodes is made of a porous metal and serves as a conduit for introducing a plasma gas into the treatment system. The plasma gas is injected into the porous electrode at substantially atmospheric pressure and allowed to diffuse through the porous electrode and the porous dielectric layer into the exposed treatment space. The two electrodes are energizes in conventional manner, using one of the electrodes as a ground, to create an electric field between them and produce a uniform glow-discharge plasma in the treatment space. The material to be treated can be exposed to the plasma so created without substantial limitation as to thickness, geometry and composition. By eliminating the need to maintain an electric field across the substrate being treated, the electrode assembly of the invention makes it possible to treat thick substrates and substrates of metallic composition that cannot be treated with prior-art equipment. In addition, powdery substrates can be treated by adding a shaker to a belt used to convey them through the plasma field.

According to another embodiment of the invention, a conventional electrode is coupled to the porous electrode through a dielectric partition in a compact assembly to produce an electric field across a treatment space adjacent to an exterior surface of the assembly. The assembly is energized in conventional manner using one of the electrodes as the ground. When a plasma gas is diffused through the porous electrode, a steady-state glow-discharge plasma is produced in the treatment space extending through the electric field and can be similarly used advantageously to treat a substrate exposed to the electrode assembly.

According to yet another aspect of the invention, vapor deposition is carried out in combination with plasma treatment by vaporizing a substance of interest, mixing it with the plasma gas, and diffusing the mixture through the porous electrode. A heater is used to maintain the temperature of the electrode above the condensation temperature o[0086] the substance to prevent deposition during diffusion. Thus, plasma treatment and vapor deposition can be carried out on a target substrate at the same time at atmospheric pressure.

Various other purposes and advantages of the invention will become clear from its description in the specification that follows and from the novel features particularly pointed out in the appended claims. Therefore, to the accomplishment of the objectives described above, this invention consists of the features hereinafter illustrated in the drawings, fully described in the detailed description of the preferred embodiment and particularly pointed out in the claims. However, such drawings and description disclose only some of the various ways in which the invention may be practiced.

DESCRIPTION OF THE PREFERRED EMBODIMENTS OF THE INVENTION

The heart of this invention lies in the idea of placing two electrodes separated by a dielectric medium side by side in a plasma treatment unit to create an electric field in a process space adjacent to the unit, and diffusing a plasma gas into the process space, preferably through a porous structure. As a result of additional experimental work performed to improve the electrodes disclosed in U.S. Pat. No. 6,118,218, we realized that a glow-discharge plasma can be produced at atmospheric pressure also in a process space that is not surrounded by the two electrodes; that is, a space that is instead adjacent to the pair of electrodes. We discovered that a new type of plasma-treatment electrode assembly can be obtained by combining the porous material of the invention with a conventional electrode encased in a dielectric cover. Using either electrode as the ground and energizing the system in conventional manner provides a very convenient electrode assembly for producing plasma from a gas diffused through the porous electrode. Thus, this discovery yielded another greatly advantageous aspect of porous-electrode utilization.

Figure 2:
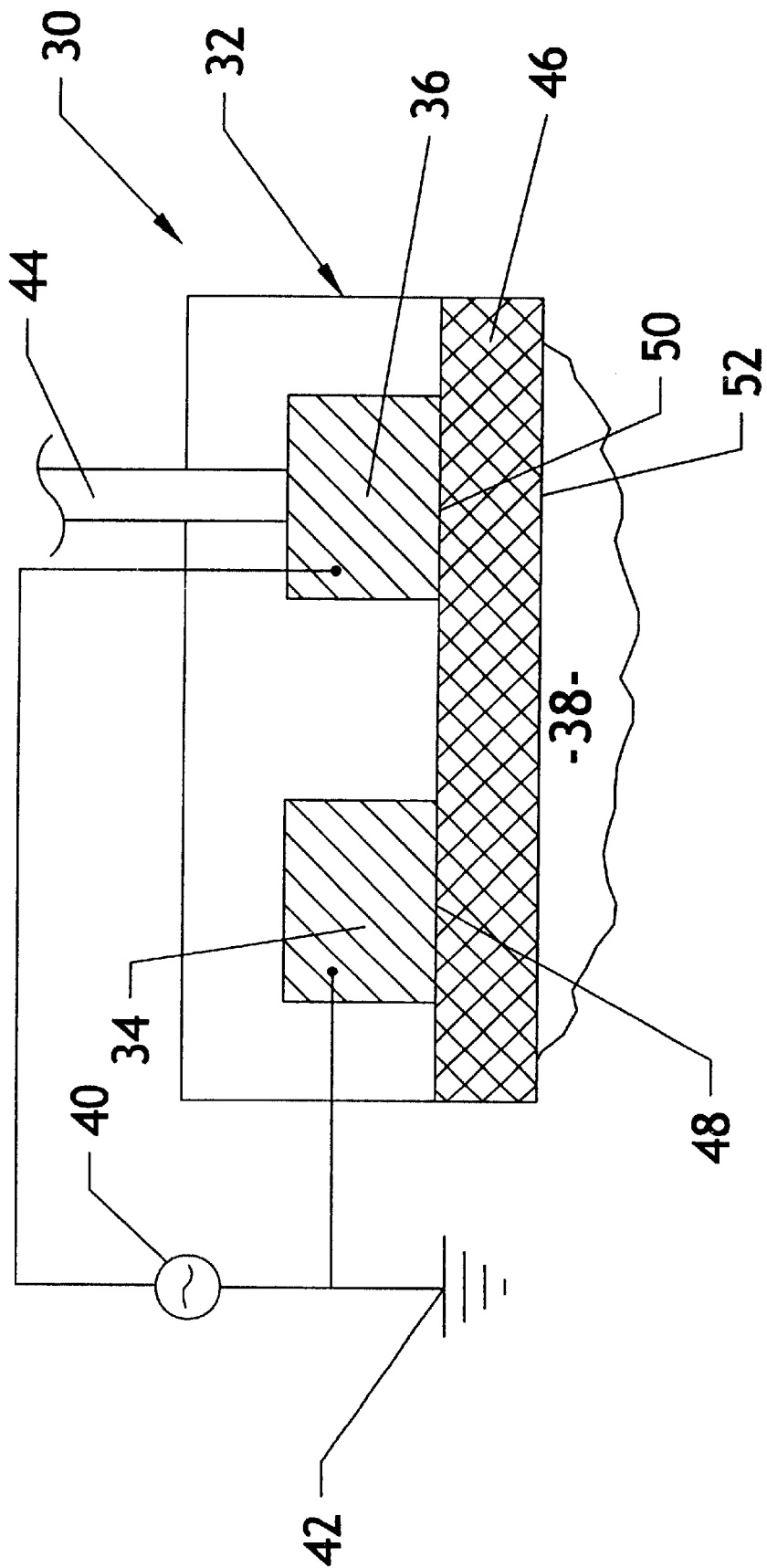
FIG. 2 is a schematic representation of an electrode assembly according to the invention wherein a porous-metal rod is used as an electrode as well as a perfusion medium in side-by-side combination with a conventional electrode encased in a dielectric medium.

Referring to the drawings, wherein like parts are designated throughout with like numerals and symbols, FIG. 2 shows a general layout of an atmospheric plasma electrode assembly 30 according to the invention. The electrode unit 30 consists of a pair of electrodes encased in a dielectric housing 32, such as a ceramic structure. A first, conventional electrode 34 is coupled to a porous electrode 36 made of the type of porous material described in U.S. Pat. No. 6,118,218. The two electrodes are placed side by side facing the process space 38 where a target substrate (such as a web on a conventional roller) is intended to be treated. The electrode assembly 30 is energized by an AC power source 40 and grounded through a ground 42 in conventional manner using either electrode as the ground. An inlet port is connected to the porous electrode 36 to feed a plasma gas to the unit 30 through the porous metal constituting the electrode. The portion 46 of the dielectric housing 32 between the porous electrode 36 and the boundary of the process space 38 consists of a porous layer capable of diffusing plasma gas received from the porous electrode into the process space. The electrodes 34,36 are preferably sized to fully fill the cavities in the housing 32 in which they are disposed, so as to avoid the formation of gaps between abutting metallic and dielectric surfaces that might produce undesirable plasma within the unit.

As a result of this configuration, an electric field is produced across the process space 38 when the electrode pair 34,26 is energized in conventional manner. The plasma gas is diffused at substantially atmospheric pressure through the porous electrode 36 and the dielectric layer 46 into the process space 38 where the electric field produces a steady-state glow-discharge plasma at power frequencies as low as 60 Hz. For best results, the sides 48 and 50 of the two electrodes facing the process space are substantially aligned with the exposed surface 52 of the porous dielectric layer 46, thereby promoting coupling of the two electrodes and producing an electric field across the process space along a plane aligned with the sides 50,52.

Figure 3:
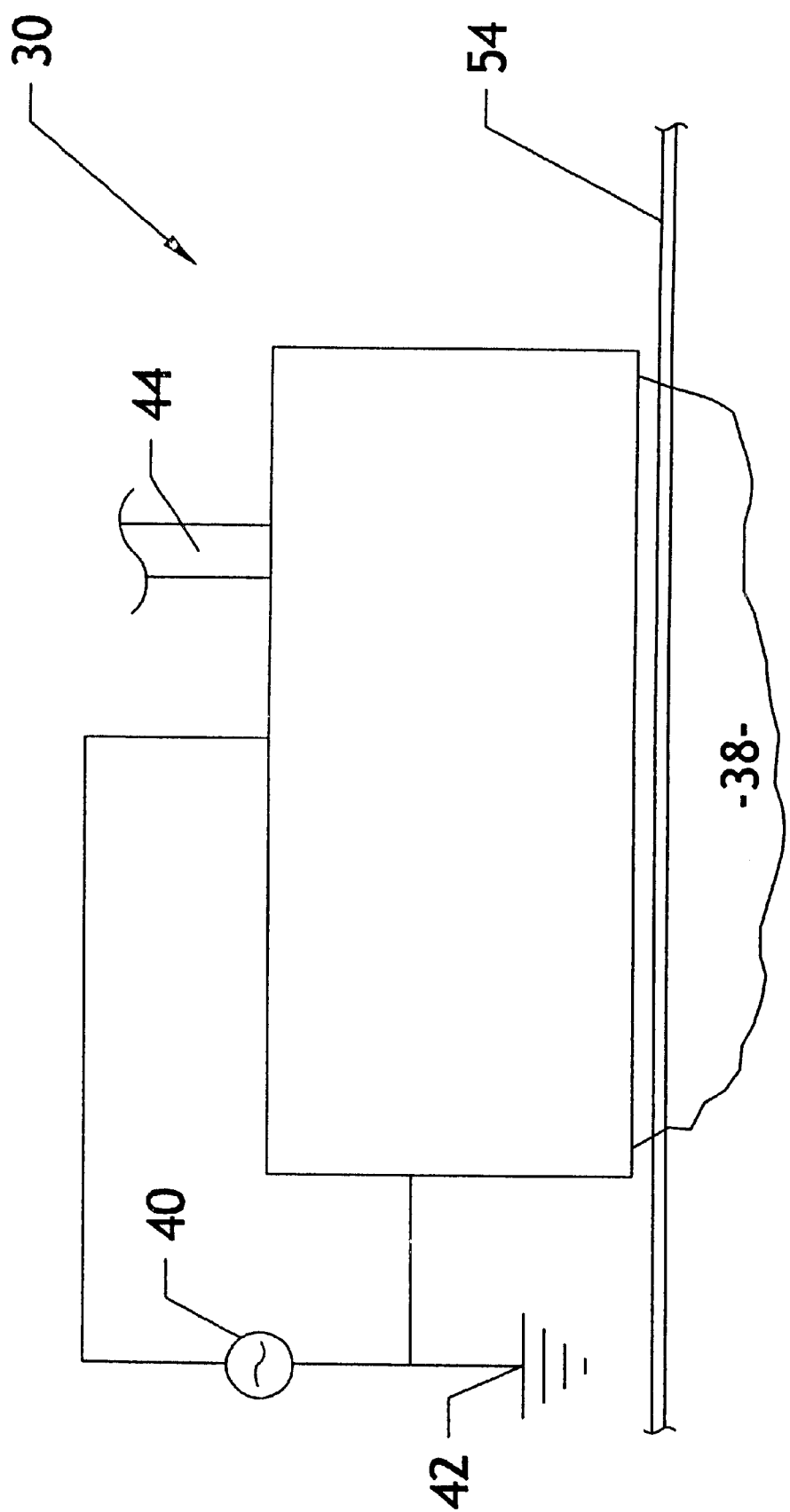
FIG. 3 shows the assembly of FIG. 2 forming a plasma field over a target substrate positioned adjacent to the electrodes.

The electrode assembly 30 is capable of producing a plasma in a planar space that is not bounded by the two electrodes. Therefore, it can be used to treat the surface of a substrate 54 simply by exposing it to the assembly, as illustrated in FIG. 3; that is, it is no longer necessary to pass the substrate between the two electrodes, as done in prior-art plasma treaters. This feature provides a significant advantage over conventional equipment because the thickness of the substrate is no longer a limitation to the feasibility of plasma treatment (in conventional plasma treaters the gap between the electrodes, which must be able to accommodate the substrate, cannot exceed the distance capable of producing an electric field). Similarly, the physical and chemical nature of the substrate is also no longer a limitation because plasma generation is unaffected by these factors which are, instead, significant in conventional equipment (for example, a metallic substrate placed over the dielectric coating of the grounded roller electrode cannot be treated because its conductivity produces an arc discharge through the substrate). Moreover, the fact that the electric field of the electrode assembly 30 of the invention does not pass across the substrate being treated is greatly advantageous because it eliminates the possibility of formation of streamers that might damage the substrate.

Obviously, any mechanical means, such as a conventional roller 12 or other linear conveying apparatus, can be used to expose the substrate 54 to the plasma field of the invention on a continuous basis. The material utilized for the dielectric casing 32 can be any of those known for conventional plasma-treatment use, such as PET, alumina, silica, barium titanate, and strontium titanate. The prototype of the invention illustrated in FIG. 2 was produced for convenience by combining two standard alumina tubes of square cross-section with walls about 2-mm thick. The electrode 34 was a conventional aluminum electrode and the porous electrode 36 was a rod of porous stainless steel, both approximately 4×4-mm thick, these dimensions being suitable to produce a steady-state diffused flow of plasma gas and a corresponding plasma field extending about 2–3 mm from the treating surface 52 of the assembly 30 (see FIG. 10).

As in the case of the electrodes described in U.S. Pat. No. 6,118,218, the AC power supply 40 can operate at any frequency between 60 Hz and the maximum frequency available from the power supply. The distance between the treating surface 52 and the substrate 54 is no longer critical, so long as appropriate to expose the substrate to the plasma field. The same plasma gases, such as helium, argon, and mixtures of an inert gas with nitrogen, oxygen, air, carbon dioxide, methane, acetylene, propane, ammonia, or mixues thereof, can be used with this electrode assembly to sustain a uniform and steady plasma at substantially atmospheric pressure. The gas is supplied through the inlet pipe 44 that feeds the porous electrode 36 of the invention. The porous electrode 36 can be made of stainless steel or any other material that may be better suited to produce the desired porous size for a particular application. The thickness of the porous electrode can vary to produce the desired plasma flow, depending on the pressure of the gas feed and the size and density of the pores, but thicknesses from about 1.5 mm to 6.5 mm have been shown by prior work to yield very good results. The dielectric layer 46 needs only to be sufficiently porous to provide a uniform flow distribution of the plasma gas. In the experimental prototype illustrated in FIG. 2, the entire dielectric casing 32 was made of porous material for testing convenience, but it is clear that limiting the porosity to the layer 46 facing the process space 38 is preferable.

For the purposes of this disclosure, the terms size and effective size of pores refer to a hypothetical diameter equal to the geometric mean of the largest and smallest dimension of the pore. As those skilled in the art would readily understand, a porous metal is a material produced by powder metallurgy. Metal powder particles of desired size are blended with a binder, if necessary, then pressed and sintered to produce a solid porous structure. The pore size is controlled by the size of the powder grains used as raw material. The term "porous metal" is intended to refer to such materials.

As disclosed in U.S. Pat. No. 6,118,218, in order for the electrode pores of the invention to operate effectively for producing an optimal glow discharge, their size must approach the mean free path of the plasma gas at the system's operating pressure. At atmospheric pressure, the mean free path of all gases typically used to produce plasma is in the submicron to micron range. Thus, by judiciously selecting the grain size and the type of metal used for producing the porous metallic layer, the electrode design of the invention can provide a structure with densely and uniformly distributed holes as small as 0.1 micron in diameter. The high density of holes in the electrode creates a uniform high-density plasma that prevents corona streamer formation and allows the use of much broader ranges of voltage frequencies and gas mixtures than previously possible at atmospheric pressure. The submicron/mnicron size of the holes approximates the mean free path of the plasma gas and it is believed to allow each pore hole to act as a hollow cathode during the negative part of the voltage cycle. This generates intense plasma that in turn enhances the level of treatment.

We found that the ideal pore size for a particular application, without limitation, is approximately within one order of magnitude greater than the mean free path of the plasma medium at the chosen operating conditions. Working with helium as the main plasma-gas component, we found that a steady atmospheric glow discharge could be sustained easily even at very low frequencies using porous metals with pores up to 10 microns in size. As the size of the pores increased over approximately 10 microns in diameter, a uniform plasma could only be produced with a high content of helium and at higher frequencies.

Figure 4A:
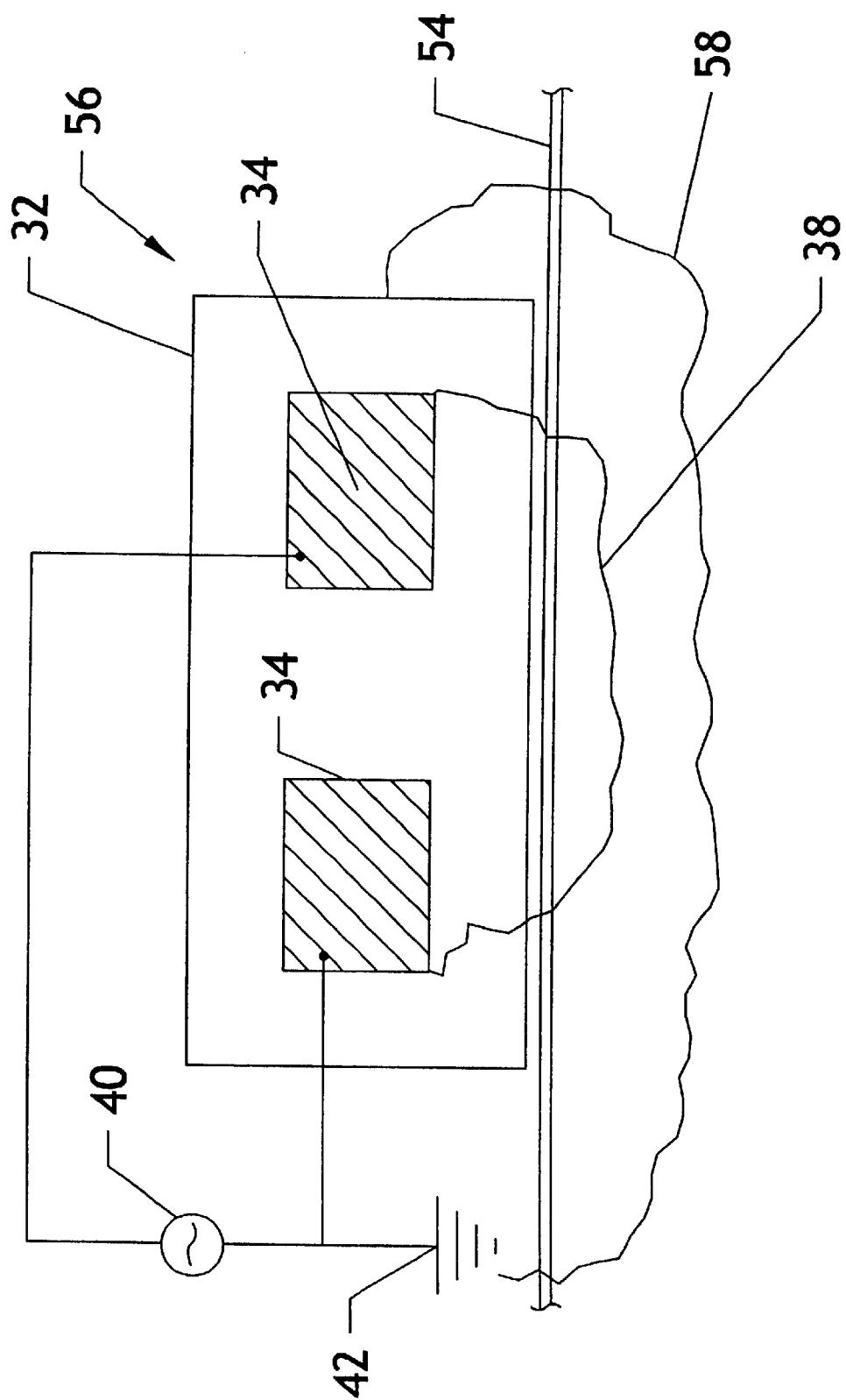
FIG. 4A is a schematic view of another embodiment of the invention wherein two conventional electrodes are encased in a dielectric housing immersed in a plasma gas and energized to produce a glow-discharge plasma at atmospheric pressure.

In another embodiment 56 of the invention shown in FIG. 4A, which is not preferred but was tested with significant success in a batch mode of operation (that is, in a static plasma gas environment), two conventional electrodes 34 were encased in a dielectric housing 32 and immersed in a plasma-gas cloud 58 over a substrate 54. We found that a uniform glow-discharge plasma was formed, free of streamers or other undesirable discharge effects, using this configuration as well. Therefore, the general concept of the invention, the production of a plasma field in a plane adjacent to two insulated electrodes, provides a new approach to plasma treatment with strong promise for unlimited flexibility of operation with regard to substrates and materials.

Figure 4B:
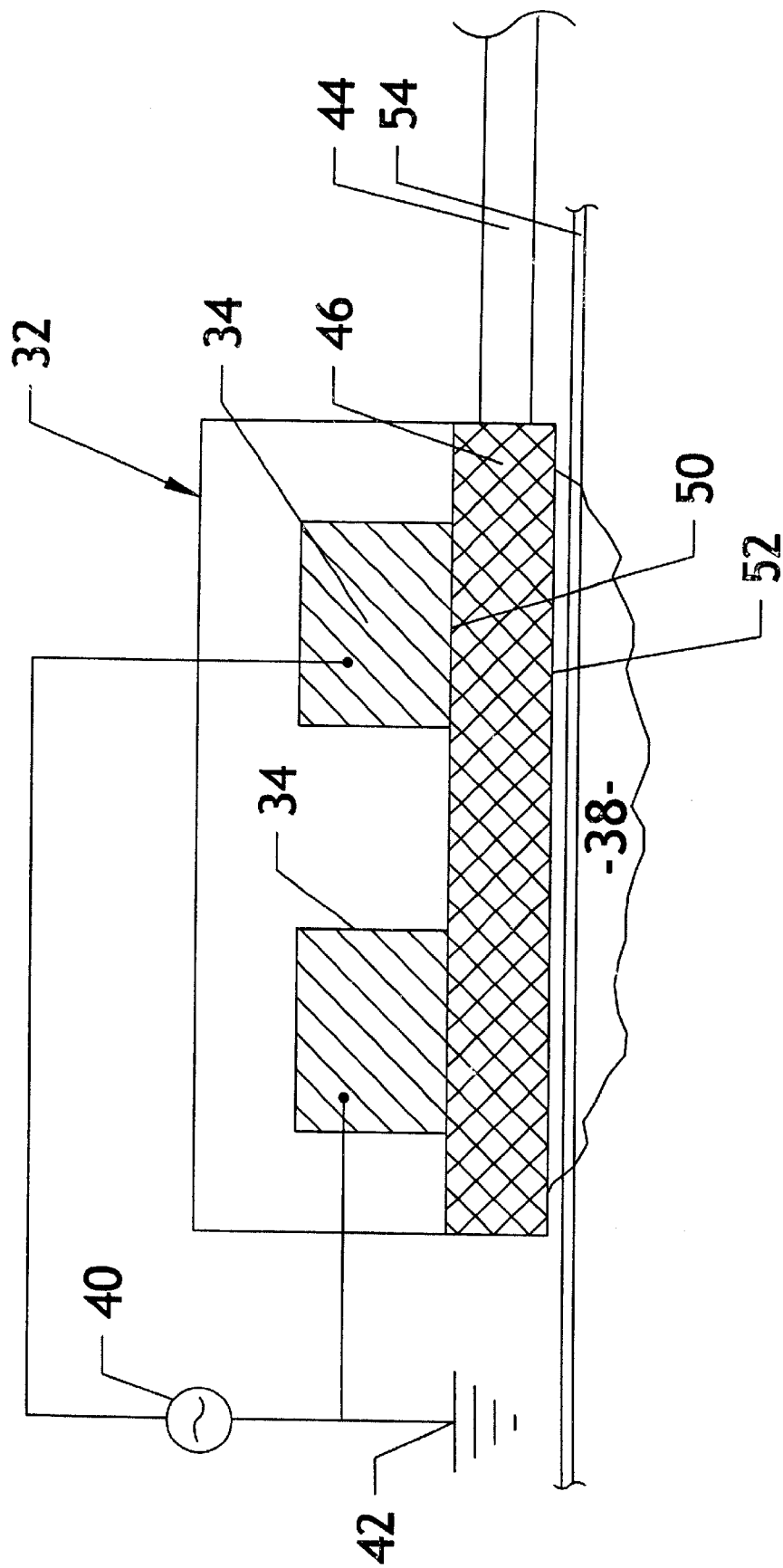
FIG. 4B is a schematic view of the embodiment of FIG. A wherein a porous-layer of the dielectric casing is used as a perfuision medium to feed plasma gas to the process space of the unit.

For best results, the electrode assembly 56 is adapted for diffusing plasma gas through the dielectric layer by providing a porous layer 46 with a gas-feed manifold 44 fluidly connected to the dielectric layer, rather than porous electrode of FIG. 2. This embodiment of the invention is illustrated in FIG. 4B Referring to FIG. 5, another electrode assembly 60 according to the invention includes a conventional electrode 34 encased in a dielectric housing 62, such as a ceramic tube, and a porous electrode 36 abutting the ceramic tube. The two electrodes are placed side by side facing the process space where a target substrate is intended to be treated. A nonporous (i.e., impermeable to plasma gas) housing 64 is used to shroud the porous electrode 34 (shown as also encasing a portion o[0086] the dielectric casing 62) to form a chamber 66 where plasma gas is fed through an appropriate inlet port 44.

In operation, the electrode assembly 60 is energized by an AC power source 40 and grounded through a ground 42 in conventional manner using either electrode as the ground. The plasma gas is diffused through the porous electrode 36 into the electric field generated between the two electrodes, where it produces a steady-state glow-discharge plasma at substantially atmospheric pressure and power frequencies as low as 60 Hz. Again, because the electrode assembly 60 is capable of producing a plasma in a planar space that is not bounded by the two electrodes, it can be used advantageously to treat the surface of a substrate simply by exposing in a plane adjacent to the assembly.

Figure 5:
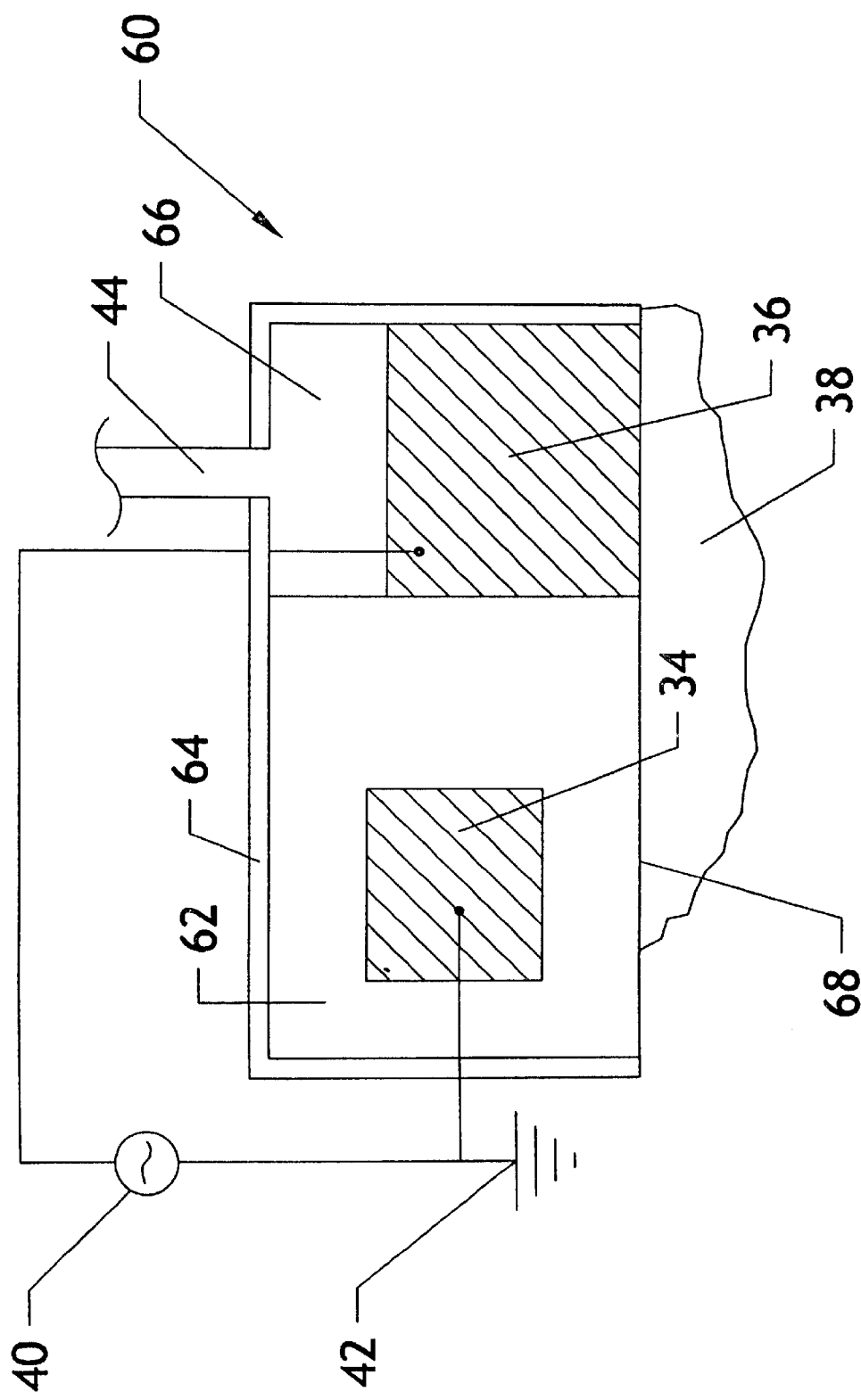
FIG. 5 is a schematic representation of an electrode assembly according to another embodiment of the invention wherein a porous-metal strip is used as an electrode as well as a perfusion medium disposed side by side with a conventional electrode encased in dielectric material.
Figure 6:
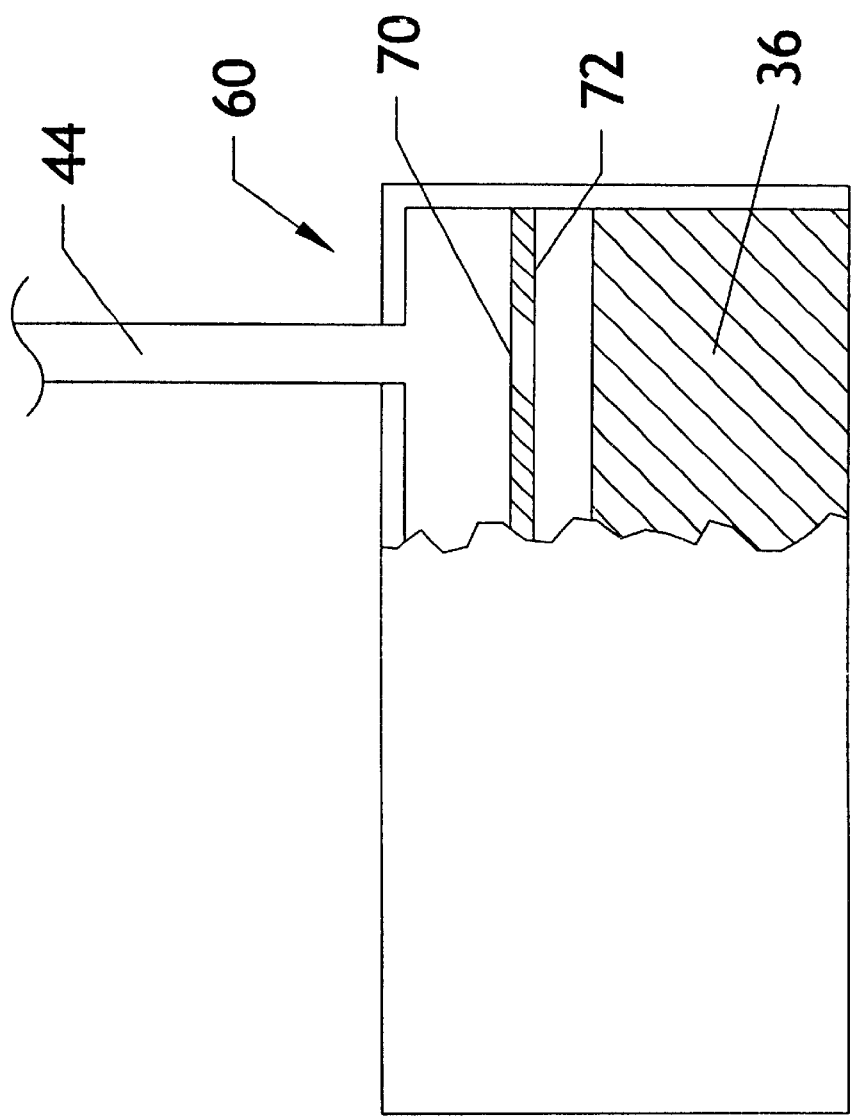
FIG. 6 is a partially cut-out view of the assembly of FIG. 5 showing a perforated baffle in the chamber containing the porous electrode of the invention.

The prototype of the invention illustrated in FIG. 5 was produced for convenience with a standard alumina tube of square cross-section and a conventional aluminum electrode 34. The porous electrode 36 consisted of a layer of porous stainless steel, approximately 2-mm wide and 4-mm thick, these dimensions being suitable to produce a steady-state diffused flow of plasma gas and a corresponding plasma field extending about 2–3 mm from the treating surface 68 of the assembly 60. The gas is supplied through the inlet pipe 44 that feeds the porous electrode 36 of the invention. As for the other embodiments of the invention disclosed in U.S. Pat. No. 6,118,218, the assembly 60 may also include a distribution baffle 70 containing multiple, uniformly spaced apertures 72 designed to distribute the gas uniformly throughout the length of the electrode 36, as illustrated in FIG. 6. The presence of the baffle 70 is not considered critical to the invention, but it helps in maintaining uniformity of gas pressure against the porous electrode through feed fluctuations, which in turn contributes to the production of a uniform glow-discharge plasma.

As for the other embodiments, the porous electrode 36 can be made of stainless steel or any other material that may be better suited to produce the desired porous size for a particular application. The thickness of the porous electrode can vary to produce the desired plasma flow, depending on the pressure of the gas feed and the size and density of the pores, but thicknesses from about 1.5 mm to 6.5 mm have been shown to yield very good results. The baffle 70 preferably consists of a stainless steel plate with holes 72 spaced every 10 cm along the main axis of the plate.

Figure 7:
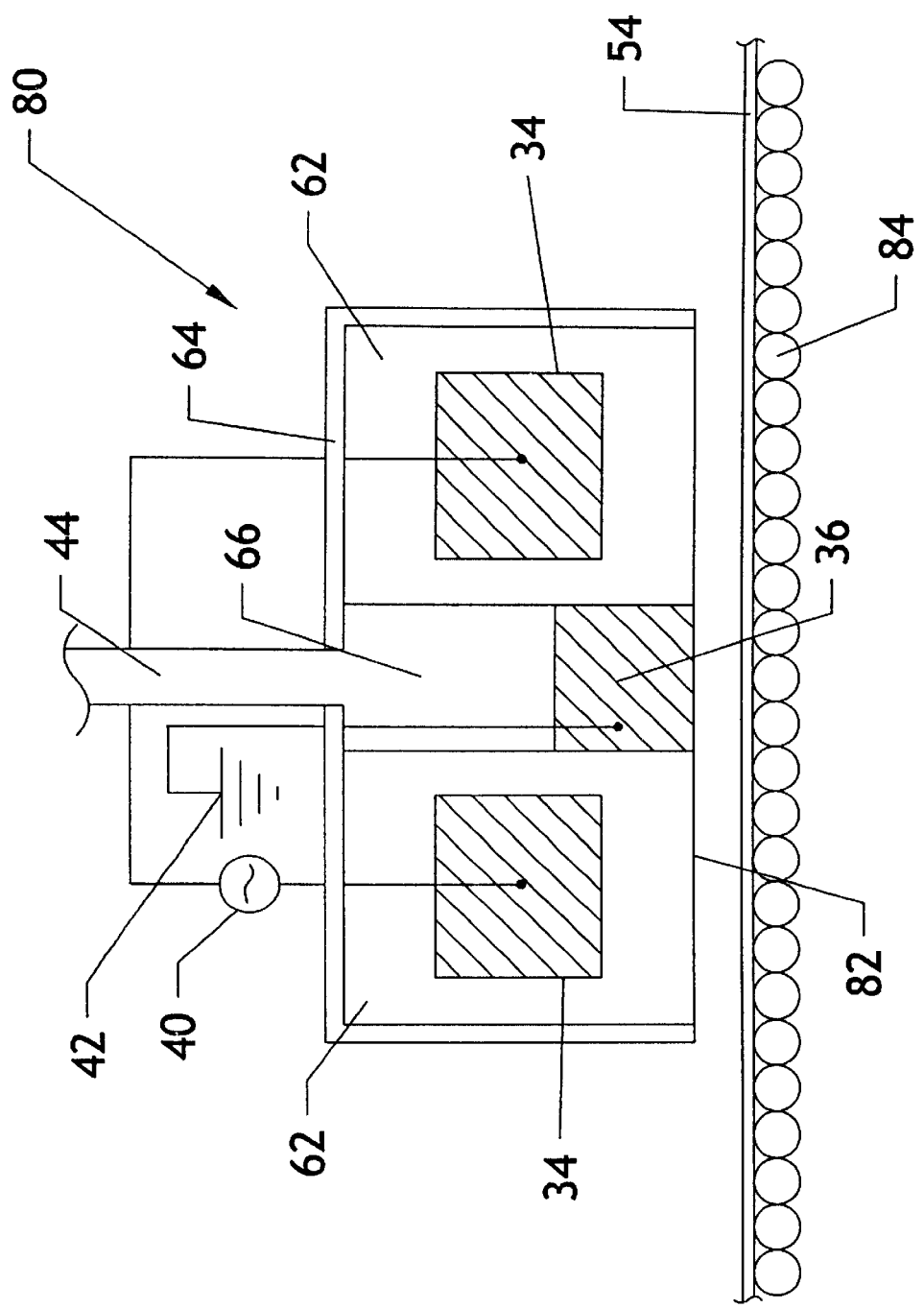
FIG. 7 is a schematic view of another embodiment of the invention wherein the porous electrode is sandwiched between two conventional electrodes encased in dielectric material.

In another embodiment 80 of the invention illustrated in FIG. 7, two electrodes 34 encased in ceramic tubes 62 are placed on each side of the porous electrode 36, thereby providing two electric fields and, correspondingly, two plasma fields extending outwardly from the treating surface 82 of the electrode assembly. Thus, the width of the plasma field is expanded to provide greater coverage of the surface of the substrate 54 being treated, which further improves the performance of the apparatus as a plasma treater. For illustration, the substrate 54 is shown being transported on a conveyor 84 in front of the treating surface 82, whereby treatment can be applied on a continuous basis to the substrate passing through the plasma field generated by the assembly 80 of the invention.

Figure 8:
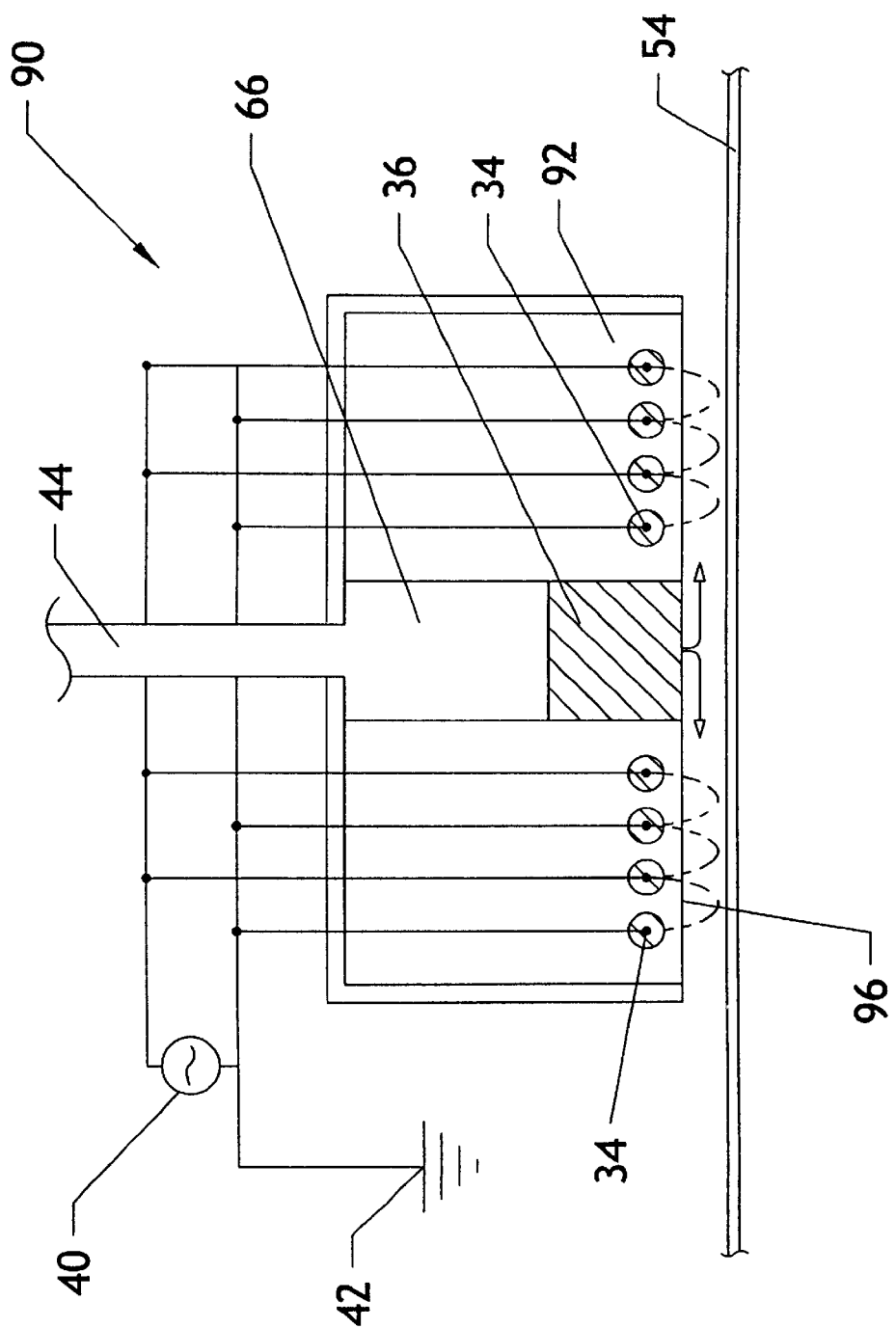
FIG. 8 is a schematic view of yet another embodiment wherein the porous material of the invention is sandwiched between two batteries of conventional electrodes encased in dielectric material and energized sequentially with opposite polarities.

In yet another embodiment 90 of the invention shown in FIG. 8, a uniform glow-discharge plasma field is produced by a series of electrodes 34 embedded in a dielectric block 92 around at least one gas channel 94 containing a porous electrode 36 as detailed above. Rather than using the porous electrode as the ground for the system, this embodiment utilizes alternate electrodes for the positive and negative terminals powered by a conventional power source 40, either terminal being connected to a ground 42. We found that this flat arrangement of a series of electrodes produces a plasma field when a suitable gas is diffused through the porous electrode, as illustrated in the figure. Accordingly, this embodiment provides an additional system for treating a film substrate 54 on a continuous basis without regard to its thickness and/or chemical makeup. Furthermore, the configuration of FIG. 8 can be expanded by alternating multiple porous electrodes 36 with correspondingly multiple batteries of electrodes 34 embedded in dielectric material, thereby providing a way to treat a relatively large area of substrate surface at the same time, if desirable. As would be obvious to one skilled in the art, the electrodes 34 are preferentially disposed closer to the treating surface 96 than any other exposed surface of the dielectric block 92 in order to promote the formation of plasma-producing electric fields along the surface 96 and extending out toward the target substrate. Additional porous electrodes 36 can be added advantageously between pairs of electrodes 34 if needed to improve plasma gas flow.

Figure 9:
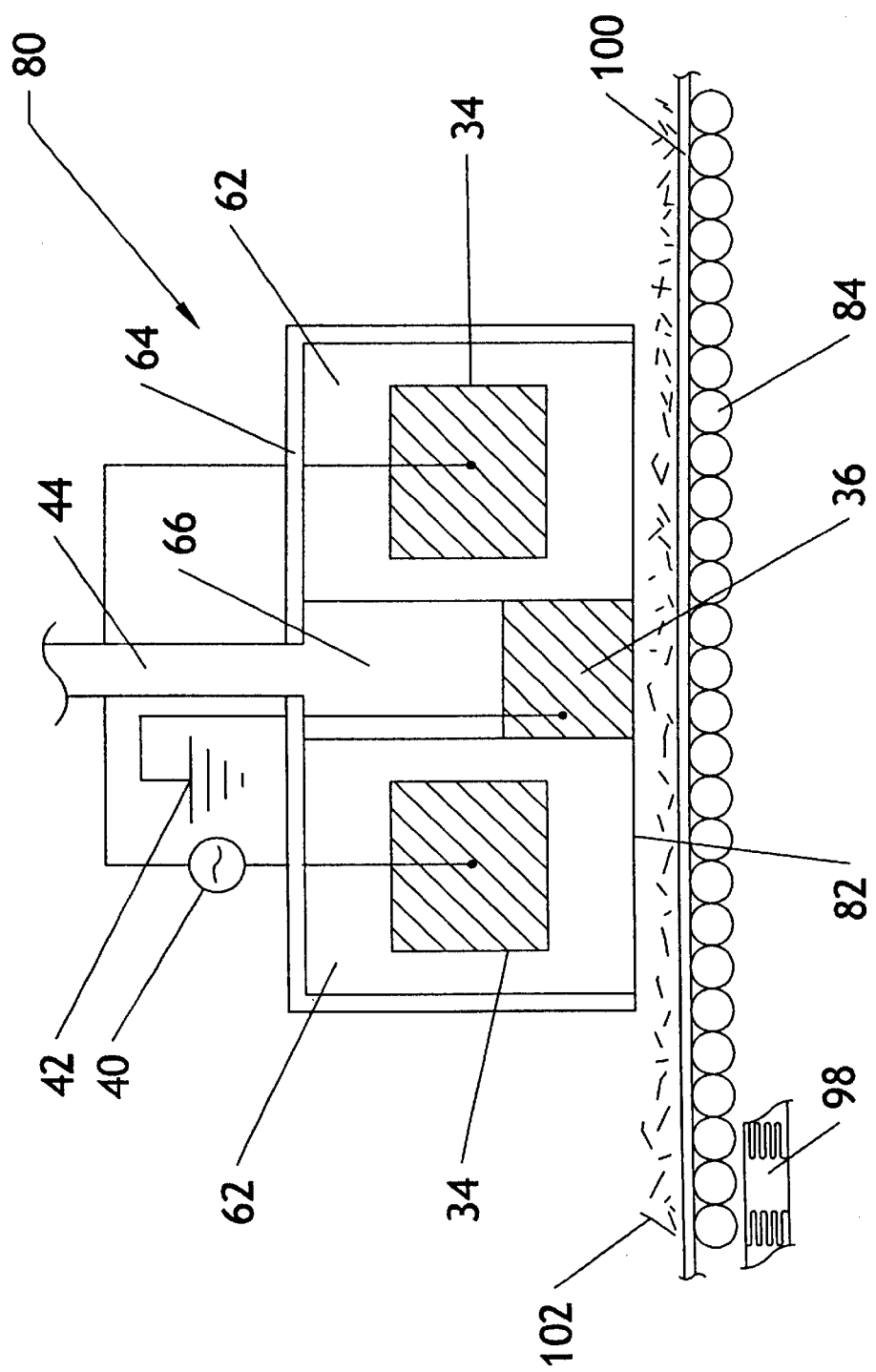
FIG. 9 is a schematic view of the electrode embodiment of FIG. 8 where a shaker or vibrator is added to a belt used to convey the substrate being treated by passing it through the plasma field.

Because the configuration of the electrodes 30, 56, 60, 80 and 90 of the invention affords more flexibility of operation than conventional plasma electrodes (due to the fact that the substrate being treated does not need to be placed between the electrode and ground), it provides a vehicle for treating a particulate substrate three dimensionally. That is, for example, a powder particle passed through the process space can be subjected to the plasma generated by the electrode 58 all around its surface by suspending and rotating it within the plasma field. To that end, as illustrated in FIG. 9, we added a shaker or vibrator 98 and a belt 100 to the conveyor 84 of FIG. 7. We then placed the powdery substrate 102 to be treated on the belt and passed it through the plasma field generated by the electrode 80 while the shaker was essentially suspending and tumbling each particle, thereby exposing it to the plasma. Accordingly, we were able to treat highly hydrophobic nanoparticles of tetrafluoroethylene (Teflon® in a helium/acetylene plasma gas (90%/10%) and change its surface energy from 19 dynes/cm to 55 dynes/cm, thereby producing a hydrophilic Teflon® powder. It is noted that for the purpose of this disclosure the term "substrate" is intended to refer to any material being subjected to plasma treatment, regardless of its shape or physical state. Accordingly, a laminar web and a powder are both referred to as substrates.

The electrodes of the invention can be used to etch polymeric substrates of all kinds of materials, as well as for treating biologically contaminated materials. Using different porous metals and wire cloths, the openings in the porous electrode were varied from about 0.1 microns to about 50 microns in effective diameter. As in the case of the electrode disclosed in U.S. Pat. No. 6,118,218, we confirmed the hypothesis that having pores of appropriate size is important to sustaining a uniform and steady plasma at atmospheric conditions, and that the optimal pore size for uniform glow discharge is in the range between the mean free path of the plasma and 20 times that size. Because of the different arrangement (side by side) of the electrodes, though, the size of the pores does not seem to be as critical and a uniform plasma was achieved under all conditions tested, even with pores as large as 44 microns (in the case of a mesh electrode).

Organic films such as polypropylene, polyethylene, and polyethylene teraphthalate substrates of various thickness were tested with the electrodes of the invention at atmospheric conditions. Various AC-voltage frequencies were used in the 60 Hz to 20 kHz range without noticeable difference in the results. Surface energies of these films were substantially enhanced by the plasma treatment. Table 1 reports the processing conditions and the range of plasma compositions for some of the tests conducted with the atmospheric plasma treater of the invention to obtain a steady and uniform plasma. The remarks adjacent to the data exemplify the results.

TABLE 1

| Power Input, W | Metal | Pore size, $\mu$ | He | Ar | $O_2$ | $CO_2$ | $N_2$ | Air | $H_2$ | $CH_4$ | $NH_3$ | Remarks |
|---|---|---|---|---|---|---|---|---|---|---|---|---|
| 200 | SS316 | 0.2 | 100 | 0 | 0 | 0 | 0 | 0 | 0 | 0 | 0 | uniform |
|  |  |  | 0–45 | 0–55 | 0 | 0 | 0 | 0 | 0 | 0 | 0 | plasma |
|  |  |  | 0–70 | 0 | 0–30 | 0 | 0 | 0 | 0 | 0 | 0 |  |
|  |  |  | 0–50 | 0 | 0 | 0–50 | 0 | 0 | 0 | 0 | 0 |  |
|  |  |  | 0–80 | 0 | 0 | 0 | 0–20 | 0 | 0 | 0 | 0 |  |
|  |  |  | 0–75 | 0 | 0 | 0 | 0 | 0–25 | 0 | 0 | 0 |  |
|  |  |  | 0–90 | 0 | 0 | 0 | 0 | 0 | 0–10 | 0 | 0 |  |
|  |  |  | 0–95 | 0 | 0 | 0 | 0 | 0 | 0 | 0–5 | 0 |  |
|  |  |  | 0–95 | 0 | 0 | 0 | 0 | 0 | 0 | 0 | 0–5 |  |
| 200 | SS316 | 0.5 | 100 | 0 | 0 | 0 | 0 | 0 | 0 | 0 | 0 | uniform |
|  |  |  | 0–70 | 0 | 0–30 | 0 | 0 | 0 | 0 | 0 | 0 | plasma |
| 200 | SS316 | 2.0 | 100 | 0 | 0 | 0 | 0 | 0 | 0 | 0 | 0 | uniform |
|  |  |  | 0–50 | 0 | 0–50 | 0 | 0 | 0 | 0 | 0 | 0 | plasma |

TABLE 1-continued

| Power Input, W | Metal | Pore size, μ | He | Ar | O₂ | CO₂ | N₂ | Air | H₂ | CH₄ | NH₃ | Remarks |
|---|---|---|---|---|---|---|---|---|---|---|---|---|
| | | | 0–50 | 0 | 0 | 0–50 | 0 | 0 | 0 | 0 | 0 | |
| | | | 0–80 | 0 | 0 | 0 | 0–20 | 0 | 0 | 0 | 0 | |
| | | | 0–75 | 0 | 0 | 0 | 0 | 0–25 | 0 | 0 | 0 | |
| 200 | SS316 | 5.0 | 100 | 0 | 0 | 0 | 0 | 0 | 0 | 0 | 0 | uniform plasma |
| 200 | SS316 | 10.0 | 100 | 0 | 0 | 0 | 0 | 0 | 0 | 0 | 0 | uniform plasma |
| | | | 0–75 | 0 | 0 | 0–25 | | | | | | |
| 200 | SS316 | 20.0 | 100 | 0 | 0 | 0 | 0 | 0 | 0 | 0 | 0 | uniform plasma |
| | | | 0–75 | 0 | 0–25 | 0 | 0 | 0 | 0 | 0 | 0 | |
| 200 | Bronze | 5.0 | 100 | 0 | 0 | 0 | 0 | 0 | 0 | 0 | 0 | uniform plasma |
| 200 | Bronze | 10.0 | 100 | 0 | 0 | 0 | 0 | 0 | 0 | 0 | 0 | uniform plasma |
| 200 | Bronze | 20.0 | 100 | 0 | 0 | 0 | 0 | 0 | 0 | 0 | 0 | uniform plasma |
| 200 | SS316 | 37* | 100 | 0 | 0 | 0 | 0 | 0 | 0 | 0 | 0 | uniform plasma |
| 200 | SS316 | 44* | 100 | 0 | 0 | 0 | 0 | 0 | 0 | 0 | 0 | uniform plasma |
| 200 | SS316 | 22* | 100 | 0 | 0 | 0 | 0 | 0 | 0 | 0 | 0 | uniform plasma |

*mesh size, tests with screen

These data show that the use of the side-by-side electrode configuration of the invention produces a uniform plasma at atmospheric conditions and that the glow discharge can be further enhanced by diffusing the plasma gas through a porous electrode, as taught in U.S. Pat. No. 6,118,218.

Figure 1:
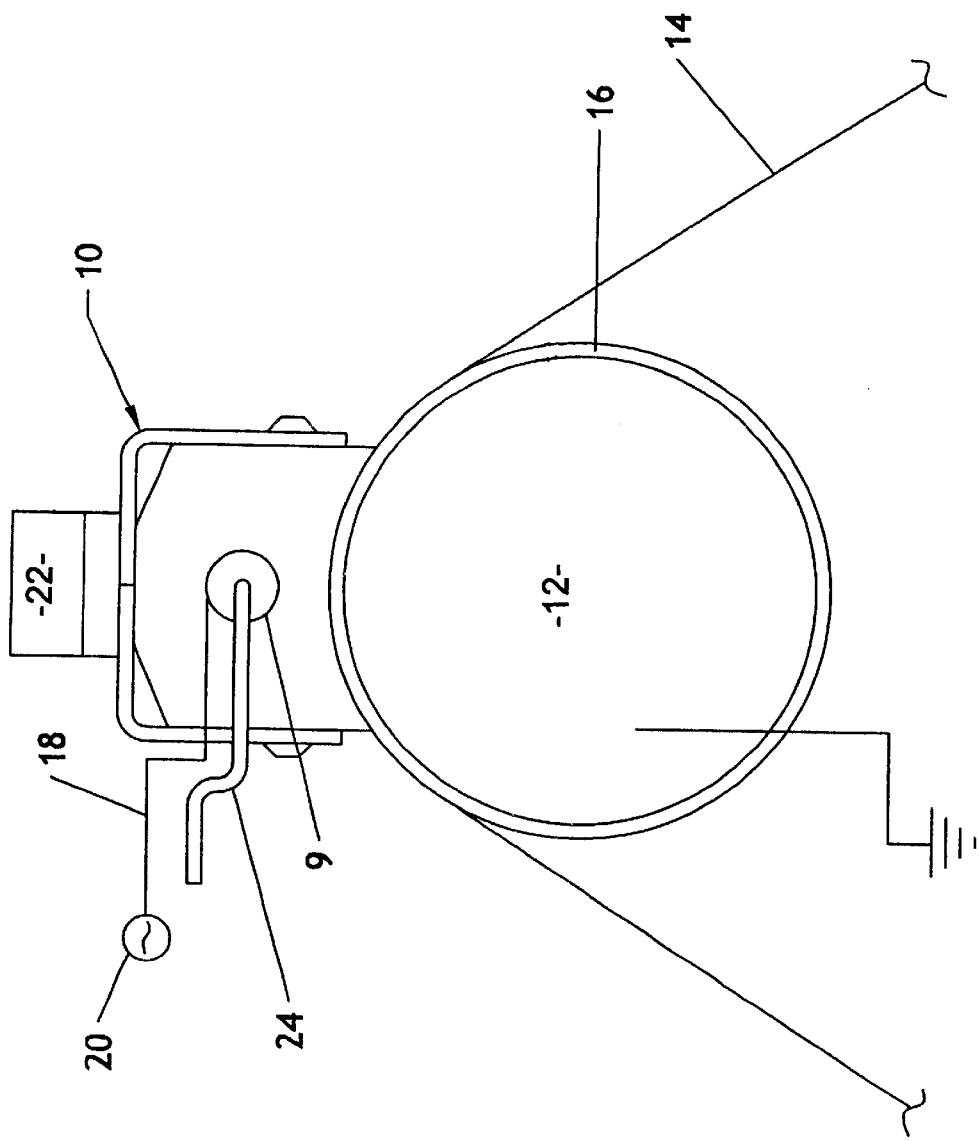
FIG. 1 is a schematic representation of a conventional atmospheric plasma treater.
Figure 10:
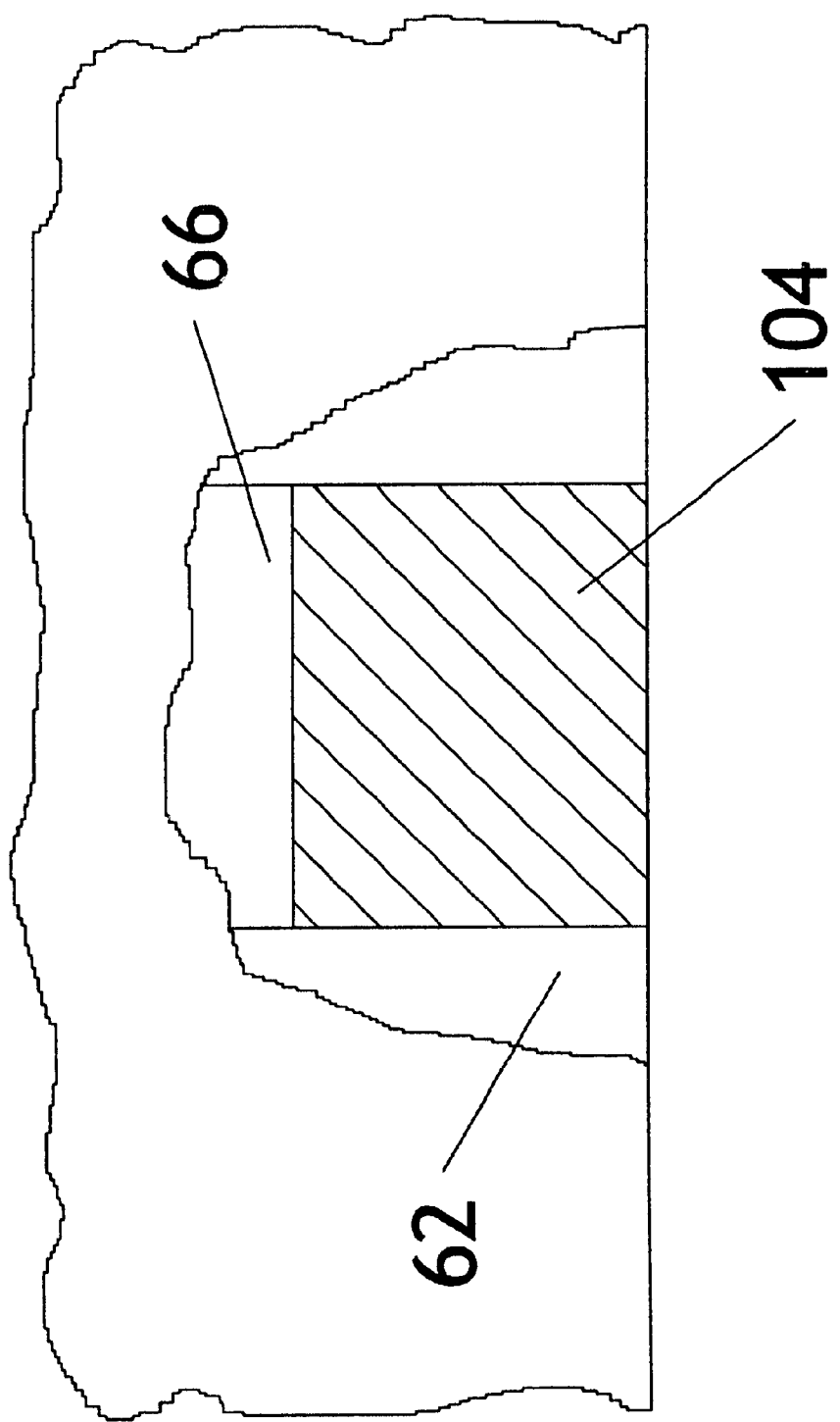
FIG. 10 is a partially cut-out view of the assembly of FIG. 8 showing the use of a layer of wire-cloth as the porous electrode of the invention.

Several tests were conducted with good results using the configuration of the electrode assemblies shown in FIGS. 2–9 mounted over a conventional but ungrounded roller 12 (FIG. 1). Various embodiments were also tested using a very tight wire mesh instead of the porous-metal electrode 36. As illustrated in the partial view of FIG. 10 showing the diffusion chamber only, a metal cloth 104 was used to enclose the chamber 76 where the plasma gas is fed. The structural configuration of the plasma treaters 60, 80 and 90 was retained in all other respects.

The examples reported below illustrate the processing conditions and the range of plasma compositions for some of the tests conducted with the atmospheric plasma treater of FIG. 7 of the invention to obtain a steady and uniform plasma. As the data indicate, surface energies of the treated films were substantially enhanced after the plasma treatment.

EXAMPLE 1

Film Treated: Polyethylene (PE) film

Base surface energy: 30 dynes/cm

Drum Speed: 18 ft/min

Drum dielectric film: PET; Four inch plasma treater

Tables 2, 3 and 4 below show the results of plasma treatment of polyethylene film using helium and mixtures of helium and carbon dioxide, helium and oxygen, and helium and acetylene in the reported amounts.

TABLE 2

| | Gases | | Power | Surface Energy, dynes/cm | |
|---|---|---|---|---|---|
| Sample | He cc/min | CO₂ cc/min | Input W | 0 | 20 hrs | 168 hrs |
| 1 | 300 | 0 | 200 | 56 | 44 | 42 |
| 2 | 300 | 15 | 200 | 52 | 50 | 46 |
| 3 | 300 | 30 | 200 | 50 | 48 | 44 |
| 4 | 300 | 60 | 200 | 52 | 44 | 42 |

TABLE 3

| | Gases | | Power | Surface Energy, dynes/cm | |
|---|---|---|---|---|---|
| Sample | He cc/min | O₂ cc/min | Input W | 0 | 20 hrs | 168 hrs |
| 1 | 300 | 15 | 200 | 54 | 48 | 44 |
| 2 | 300 | 30 | 200 | 56 | 48 | 44 |
| 3 | 300 | 60 | 200 | 52 | 46 | 42 |
| 4 | 300 | 90% | 200 | 54 | 42 | 40 |

TABLE 4

| | Gases | | Power | Surface Energy, dynes/cm | |
|---|---|---|---|---|---|
| Sample | He cc/min | C₂H₂ cc/min | Input W | 0 | 20 hrs | 168 hrs |
| 1 | 300 | 15 | 200 | 56 | 56 | 56 |
| 2 | 300 | 30 | 200 | 54 | 54 | 52 |
| 3 | 300 | 60 | 200 | 52 | 50 | 50 |

EXAMPLE 2

Substrate: Teflon Powder (Nano particles)
Drum Speed: 18 ft/min
Drum dilectric film: PET; Four inch plasma treater The following table shows the results of plasma treatment of Teflon powder using helium and acetylene ($C_2H_2$) in the reported amounts.

TABLE 5

| Sample | Gases | | Power Input | Elemental analysis (Atom %) | | |
|---|---|---|---|---|---|---|
| | He cc/min | $C_2H_2$ cc/min | W | Oxygen | Carbon | Fluorine |
| Control untreated | — | — | — | <0.1 | | 66.9 |
| 1 | 300 | 15 | 200 | 14.9 | 47.9 | 36.7 |
| 2 | 300 | 30 | 200 | 28.4 | 68 | 2.7 |
| 3 | 300 | 60 | 200 | 9.3 | 44.2 | 46.2 |

These results show that the electrodes of the invention can be used for treating and modifying the surface properties of organic and inorganic substrates without the material and thickness limitations imposed by prior-art techniques and equipment. Because it performs well at atmospheric pressure, these electrodes do not require vacuum equipment, produce high density plasma, and the treatment of various surfaces can be performed at low temperatures. In addition, we found that a steady glow discharge can be produced at substantially lower frequencies than previously possible. Many tests were run routinely with success at 1 kHz, and good glow discharge was produced at frequencies as low as 60 Hz. In addition, the porous electrode of the invention made it possible to obtain steady atmospheric glow discharge with gas mixtures containing as little as 45 percent helium, which is not possible with any prior-art device.

Thus, those skilled in the art will readily appreciate the wide range of potential applications for this invention in areas such as surface treatment/functionalization o[0086] polymer films for the food-packaging industry; plasma-enhanced chemical vapor deposition for barrier films in the packaging industry; plasma etching for the microelectronics industry; plasma grafting and plasma polymerization; the treatment of fabrics, wool, metal and paper; and the sterilization of biologically contaminated materials. In particular, surface functionalization o[0086] polymer films by plasma is the most effective way for a uniform and controlled treatment. Using this invention, the surface energy of the films can be controlled by plasma treatment to enhance the wettability, printability and adhesion of coatings. Substrate films can now be treated with great advantage without regard to their conductivity or thickness.

Figure 11:
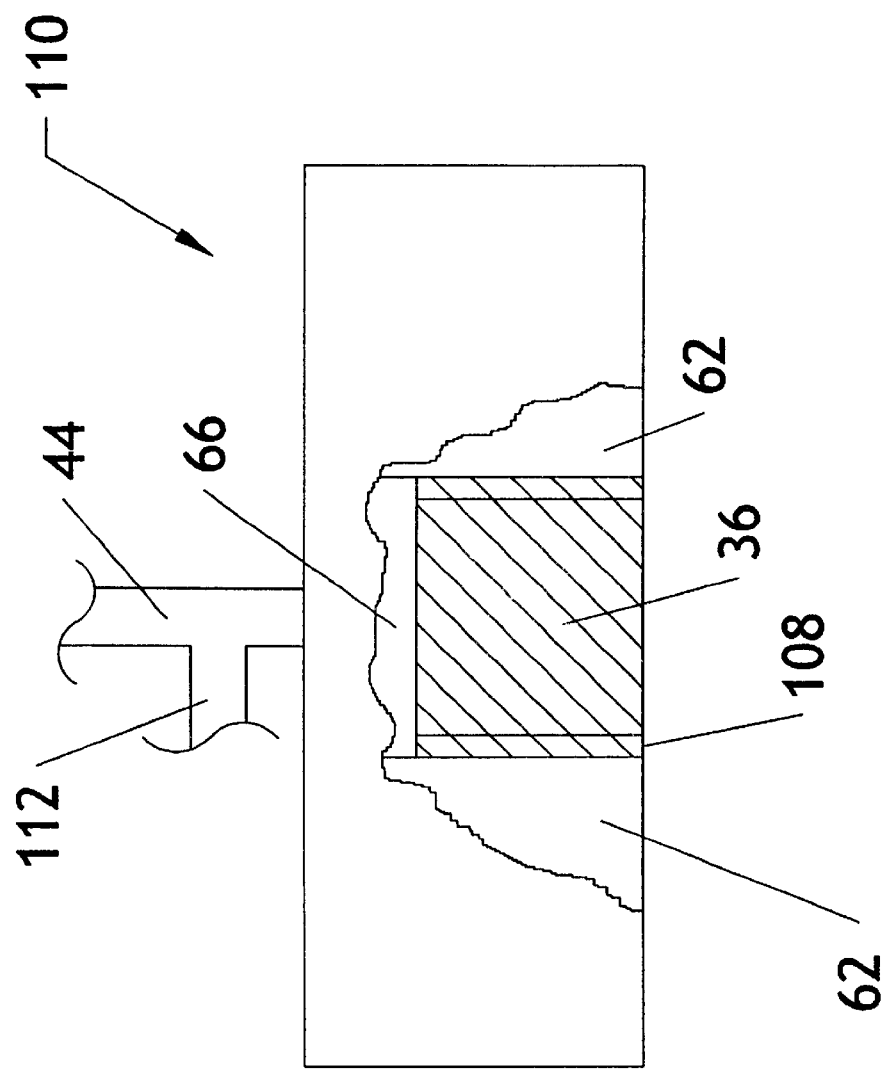
FIG. 11 is a partially cut-out view of the assembly of FIG. 8 showing an inlet port for vaporized material and a heater wrapped around the porous electrode of the invention for combining plasma treatment with vapor deposition at atmospheric pressure.

Several prior-art vacuum plasma processes have been combined with vacuum deposition techniques to enhance the surface properties of various kinds of products. For example, acrylonitriles and vinylidene chlorides are used to create high-barrier coatings to oxygen and moisture; and acryloyl chloride and vinylidene fluoride molecules are added to provide a high surface energy and an increased dielectric constant, respectively. Accordingly, we also tested the combination of the atmospheric glow-discharge plasma process of the invention with vapor deposition of these and other substances. For that purpose, the apparatus was modified by adding a heater 108, such as an electric coil, to the porous electrode 36 of the invention, as illustrated in the embodiment 110 of FIG. 11 (corresponding to the assembly 90 of FIG. 18. The material selected for vapor deposition was vaporized at atmospheric pressure and combined with plasma gas through a port 112 in conventional proportions to form conventional vapor/gas mixtures as taught by the prior art for vacuum plasma/deposition processes. The mixture fed into the plasma chamber 66 was then diffused through the porous electrode 36 according to the invention to create a plasma field containing vaporized material for plasma and vapor-deposition treatment of the substrate material, as described above. The heater 108 was needed to maintain the vaporized state of the vapor-deposition material while the gas/vapor mixture was difflused through the porous electrode 36. As would be clear to one skilled in the art, the heater 108 must be capable of maintaining the electrode temperature uniformly above the vaporization temperature of the deposition material at atmospheric pressure. We found that a temperature range from 70° C. to 100° C. is sufficient for most materials of interest. Tests with all embodiments of the invention described herein yielded successful plasma treatment and vapor deposition, confirming the feasibility of the combined approach at atmospheric pressure using the porous electrode of the invention.

Various changes in the details, steps and components that have been described may be made by those skilled in the art within the principles and scope of the invention herein illustrated and defined in the appended claims. Therefore, while the present invention has been shown and described herein in what is believed to be the most practical and preferred embodiments, it is recognized that departures can be made therefrom within the scope of the invention, which is not to be limited to the details disclosed herein but is to be accorded the full scope of the claims so as to embrace any and all equivalent processes and products.

We claim:

1. An electrode assembly for producing a glow-discharge plasma in a process space adjacent thereto at substantially atmospheric pressure, comprising the following combination of components:

a first electrode encased in a dielectric material facing said process space;

a second electrode comprising a metallic porous layer facing said process space alongside the first electrode;

means for applying a voltage across the electrodes; and means for diffusing a plasma gas through the metallic porous layer into the process space at substantially atmospheric pressure.

2. The apparatus of claim 1, wherein said electrode comprising a metallic porous layer includes an enclosed chamber containing a metallic porous portion, and said means for diffusing a plasma gas through the metallic porous layer includes a conduit into the enclosed chamber.

3. The apparatus of claim 2, further comprising a baffle within said enclosed chamber, said baffle containing a plurality of perforations adapted to produce a substantially uniform flow of the plasma gas to the metallic porous portion.

4. The apparatus of claim 1, wherein said plasma gas has a mean free path at atmospheric pressure and the metallic porous layer has pores with an effective diameter substantially within one order of magnitude greater than said mean free path.

5. The apparatus of claim 1, wherein said plasma gas comprises helium and said pores have an effective diameter smaller than 20 microns.

6. The apparatus of claim 1, further comprising means for passing a substrate through said glow-discharge plasma in order to enhance a surface characteristic of the substrate.

7. The apparatus of claim 6, wherein said means for passing a substrate through said glow-discharge plasma includes a shaker for exposing multiple sides of a particulate substrate to the glow-discharge plasma.

8. The apparatus of claim 1, wherein said metallic porous layer includes a layer of metallic wire-cloth.

9. The apparatus of claim 1, further comprising means for mixing a vaporized substance with said plasma gas and a heater for heating the metallic porous layer to a temperature greater than a vaporization temperature of the vaporized substance.

10. An electrode assembly for producing a glow-discharge plasma in a process space adjacent thereto at substantially atmospheric pressure, comprising the following combination of components:
   a first electrode facing said process space;
   a second electrode comprising a metallic porous layer facing said process space alongside the first electrode;
   a layer of dielectric material interposed between the first electrode and the process space and between the first and second electrodes;
   means for applying a voltage across the electrodes; and
   means for diffusing a plasma gas through the metallic porous layer into the process space at substantially atmospheric pressure.

11. The apparatus of claim 10, wherein said electrode comprising a metallic porous layer includes an enclosed chamber containing a metallic porous portion, and said means for diffusing a plasma gas through the metallic porous layer includes a conduit into the enclosed chamber.

12. The apparatus of claim 11, further comprising a baffle within said enclosed chamber, said baffle containing a plurality of perforations adapted to produce a substantially uniform flow of the plasma gas to the metallic porous portion.

13. The apparatus of claim 10, wherein said plasma gas has a mean free path at atmospheric pressure and the metallic porous layer has pores with an effective diameter substantially within one order of magnitude greater than said mean free path.

14. The apparatus of claim 10, wherein said plasma gas comprises helium and said pores have an effective diameter smaller than 20 microns.

15. The apparatus of claim 10, further comprising means for passing a substrate through said glow-discharge plasma in order to enhance a surface characteristic of the substrate.

16. The apparatus of claim 15, wherein said means for passing a substrate through said glow-discharge plasma includes a shaker for exposing multiple sides of a particulate substrate to the glow-discharge plasma.

17. The apparatus of claim 10, wherein said metallic porous layer includes a layer of metallic wire-cloth.

18. The apparatus of claim 10, further comprising means for mixing a vaporized substance with said plasma gas and a heater for heating the metallic porous layer to a temperature greater than a vaporization temperature of the vaporized substance.

19. An electrode assembly for producing a glow-discharge plasma in a process space adjacent thereto at substantially atmospheric pressure, comprising the following combination of components:
   a plurality of electrodes encased in a dielectric material facing said process space;
   at least one metallic porous layer facing the process space and enclosed within the dielectric material encasing said plurality of electrodes;
   means for applying a voltage across pairs of said plurality of electrodes; and
   means for diffusing a plasma gas through the metallic porous layer into the process space at substantially atmospheric pressure.

20. The apparatus of claim 19, wherein said electrode comprising a metallic porous layer includes an enclosed chamber containing a metallic porous portion, and said means for diffusing a plasma gas through the metallic porous layer includes a conduit into the enclosed chamber.

21. The apparatus of claim 20, further comprising a baffle within said enclosed chamber, said baffle containing a plurality of perforations adapted to produce a substantially uniform flow of the plasma gas to the metallic porous portion.

22. The apparatus of claim 19, wherein said plasma gas has a mean free path at atmospheric pressure and the metallic porous layer has pores with an effective diameter substantially within one order of magnitude greater than said mean free path.

23. The apparatus of claim 19, wherein said plasma gas comprises helium and said pores have an effective diameter smaller than 20 microns.

24. The apparatus of claim 19, further comprising means for passing a substrate through said glow-discharge plasma in order to enhance a surface characteristic of the substrate.

25. The apparatus of claim 24, wherein said means for passing a substrate through said glow-discharge plasma includes a shaker for exposing multiple sides of a particulate substrate to the glow-discharge plasma.

26. The apparatus of claim 19, wherein said metallic porous layer includes a layer of metallic wire-cloth.

27. The apparatus of claim 19, further comprising means for mixing a vaporized substance with said plasma gas and a heater for heating the metallic porous layer to a temperature greater than a vaporization temperature of the vaporized substance.

28. An electrode assembly for producing a glow-discharge plasma in a process space adjacent thereto at substantially atmospheric pressure and for treating a target substrate within said process space, comprising the following combination of components:
   a plurality of electrodes encased in a dielectric material and disposed planarly facing said process space from a single side;
   means for applying a voltage across pairs of said plurality of electrodes;
   means for supplying a plasma gas in said process space at substantially atmospheric pressure; and
   means for passing the target substrate through said process space along a plane facing said plurality of electrodes.

29. The apparatus of claim 28, wherein said supplying means includes means for diffusing a plasma gas into the process space at substantially atmospheric pressure through the dielectric material.

30. The apparatus of claim 28, wherein said means for passing a substrate through said glow-discharge plasma includes a shaker for exposing multiple sides of a particulate substrate to the glow-discharge plasma.

31. The apparatus of claim 28, further comprising means for mixing a vaporized substance with said plasma gas.

32. A method for producing a glow-discharge plasma in a process space at substantially atmospheric pressure, comprising the following steps:
   providing a first electrode and a second electrode separated by a dielectric material and facing said process space;

applying a voltage across the electrodes; and diffusing a plasma gas into the process space through a porous material at substantially atmospheric pressure.

33. The method of claim 32, wherein said porous material is a metallic porous layer in said second electrode and said step of diffusing a plasma gas into the process space is carried out through a conduit feeding an enclosed chamber in the second electrode.

34. The method of claim 33, wherein said plasma gas has a mean free path at atmospheric pressure and the metallic porous layer has pores with an effective diameter substantially within one order of magnitude greater than said mean free path.

35. The method of claim 34, wherein said plasma gas comprises helium and said pores have an effective diameter smaller than 20 microns.

36. The method of claim 33, wherein said metallic porous layer includes a layer of metallic wire-cloth.

37. The method of claim 32, further comprising the step of passing a substrate through said glow-discharge plasma in order to enhance a surface characteristic of the substrate.

38. The method of claim 37, further including the step of shaking a particulate substrate for exposing multiple sides thereof to the glow-discharge plasma.

39. The method of claim 32, further comprising the steps of mixing a vaporized substance with said plasma gas.

* * * * *